United States Patent
Wang (10) Patent No.: US 12,369,497 B2
(45) Date of Patent: Jul. 22, 2025

(54) MAGNETORESISTIVE RANDOM ACCESS MEMORY DEVICE AND METHOD FOR FABRICATING THE SAME

(71) Applicant: UNITED MICROELECTRONICS CORP., Hsin-Chu (TW)

(72) Inventor: Hui-Lin Wang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 200 days.

(21) Appl. No.: 18/216,610

(22) Filed: Jun. 30, 2023

(65) Prior Publication Data

US 2024/0415024 A1 Dec. 12, 2024

(30) Foreign Application Priority Data

Jun. 9, 2023 (TW) .................................. 112121667

(51) Int. Cl.
*H10N 50/10* (2023.01)
*G11C 11/16* (2006.01)
*H10B 61/00* (2023.01)
*H10N 50/01* (2023.01)
*H10N 50/80* (2023.01)

(52) U.S. Cl.
CPC ........... *H10N 50/10* (2023.02); *G11C 11/161* (2013.01); *H10B 61/00* (2023.02); *H10N 50/01* (2023.02); *H10N 50/80* (2023.02)

(58) Field of Classification Search
CPC ........ H10N 50/10; H10N 50/01; H10N 50/80; H10N 50/20; H10N 50/85; G11C 11/161; H10B 61/00
USPC ........................................................ 365/158
See application file for complete search history.

(56) References Cited

U.S. PATENT DOCUMENTS

| 9,230,626 | B2 | 1/2016 | Buhrman et al. |
| 9,954,166 | B1 * | 4/2018 | Lin ....................... H10N 70/011 |
| 9,959,500 | B1 * | 5/2018 | Torng .................. H01L 23/5226 |
| 2017/0133588 | A1 * | 5/2017 | Bedau ..................... H10N 70/20 |
| 2020/0105999 | A1 * | 4/2020 | Jeong ..................... H10N 50/10 |
| 2023/0389440 | A1 * | 11/2023 | Song ....................... H10N 50/85 |
| 2024/0389469 | A1 * | 11/2024 | van der Straten ..... H10B 61/00 |

FOREIGN PATENT DOCUMENTS

CN 116157003 A * 5/2023

* cited by examiner

*Primary Examiner* — Fernando Hidalgo
(74) *Attorney, Agent, or Firm* — Winston Hsu (57) ABSTRACT

A magnetoresistive random access memory device includes a bottom electrode, a spin orbit torque (SOT) layer, a magnetic tunneling junction (MTJ) and a top electrode. The bottom electrode includes a first layer and a second layer connected with the first layer. A material of the first layer includes $Ta_{x1}N_{y1}$, a material of the second layer includes $Ta_{x2}N_{y2}$, and the following relationships are satisfied: $y2/x2>1$, $y1/x1\geq 1$, and $y2/x2>y1/x1$. The SOT layer is disposed on the bottom electrode. The MTJ is disposed on the SOT layer. The top electrode is disposed on the MTJ.

20 Claims, 9 Drawing Sheets

MAGNETORESISTIVE RANDOM ACCESS MEMORY DEVICE AND METHOD FOR FABRICATING THE SAME

BACKGROUND OF THE INVENTION

1. Field of the Invention

The present disclosure relates to the field of semiconductor devices, and more particularly, to a method for fabricating a magnetoresistive random access memory (MRAM) device.

2. Description of the Prior Art

With the thin and light trend of mobile devices and the requirement of the popularization of the internet of things (IOT) in the future, the industry's requirements for recording density and performance of memory devices are increased. MRAM devices have attracted high attention due to advantages of fast read and write speed, non-volatility, and easy integration with semiconductor manufacturing processes, etc.

However, the MRAM devices on the market have not yet met expectations in all aspects. For example, spin torque transfer (STT) is one of the techniques adopted by current MRAM devices to switch the magnetic moment. When using STT to switch the magnetic moment, the two ferromagnetic layers of the magnetic tunneling junction (MTJ) receive the transfer torque provided by the current at the same time. Therefore, the difference of the coercivity between the upper and lower ferromagnetic layers is very small, and there is a certain probability that the magnetic moment in the free layer and the magnetic moment in the reference layer (also called as a pinned layer) are switched at the same time during writing, resulting in write errors. To reduce write errors, the waiting time of write is required to be maintained at a certain minimum value, so that the write speed of the STT type MRAM device cannot be enhanced. Therefore, how to improve the performance of the MRAM devices is still one of the topics in the industry.

SUMMARY OF THE INVENTION

According to one aspect of the present disclosure, a MRAM device includes a bottom electrode, a spin orbit torque (SOT) layer, a MTJ and a top electrode. The bottom electrode includes a first layer and a second layer connected with the first layer. A material of the first layer includes $Ta_{x1}N_{y1}$, a material of the second layer includes $Ta_{x2}N_{y2}$, and the following relationships are satisfied: $y2/x2>1$, $y1/x1 \geq 1$, and $y2/x2>y1/x1$. The SOT layer is disposed on the bottom electrode. The MTJ is disposed on the SOT layer. The top electrode is disposed on the MTJ.

According to another aspect of the present disclosure, a MRAM device includes a bottom electrode, a SOT layer, a MTJ and a top electrode. The bottom electrode defines a normal direction. A material of the bottom electrode includes $Ta_xN_y$, $y/x$ is increased gradiently along the normal direction from a first surface of the bottom electrode to a second surface of the bottom electrode, and the following relationship is satisfied: $y/x \geq 1$. The SOT layer is disposed on the first surface of the bottom electrode. The MTJ is disposed on the SOT layer. The top electrode is disposed on the MTJ.

According to yet another aspect of the present disclosure, a method for fabricating a MRAM device includes steps as follows. A bottom electrode is formed, wherein a material of the bottom electrode includes $Ta_{x1}N_{y1}$ and $Ta_{x2}N_{y2}$, and the following relationships are satisfied: $y2/x2>1$, $y1/x1 \geq 1$, and $y2/x2>y1/x1$. A SOT layer is formed on the bottom electrode. A MTJ is formed on the SOT layer. A top electrode is formed on the MTJ.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom or top is used with reference to the orientation of the Figure(s) being described. The elements of the present disclosure can be positioned in a number of different orientations. As such, the directional terminology is used for purposes of illustration and is in no way limiting. In addition, identical numeral references or similar numeral references are used for identical elements or similar elements in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

It is understood that, although the terms first, second, etc. may be used herein to describe various elements, regions, layers and/or sections, these elements, regions, layers and/or sections should not be limited by these terms. These terms may be only used to distinguish one element, region, layer and/or section from another element, region, layer and/or section. Terms such as "first," "second," and other numerical terms when used herein do not imply a sequence or order unless clearly indicated by the context. Thus, a first element, region, layer and/or section discussed below could be termed a second element, region, layer and/or section without departing from the teachings of the embodiments. The terms used in the claims may not be identical with the terms used in the specification, but may be used according to the order of the elements claimed in the claims.

According to one embodiment of the present disclosure, a method for fabricating a MRAM device includes steps as follows. A bottom electrode is formed, wherein a material of the bottom electrode includes $Ta_{x1}N_{y1}$ and $Ta_{x2}N_{y2}$, and the following relationships are satisfied: y2/x2>1, y1/x1>1, and y2/x2>y1/x1. A SOT layer is formed on the bottom electrode. A MTJ is formed on the SOT layer. A top electrode is formed on the MTJ.

Figure 1:
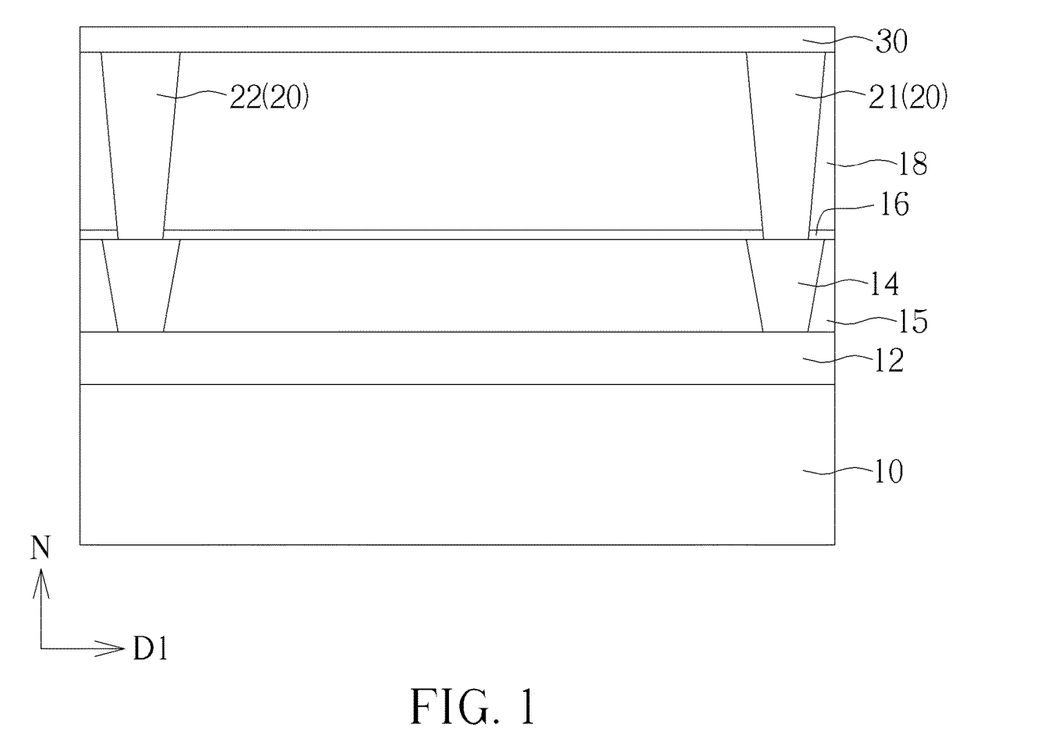
FIG. 1, FIG. 2, FIG. 3, FIG. 4 and FIG. 5 are schematic diagrams showing steps for fabricating a MRAM device according to one embodiment of the present disclosure.

Please refer to FIG. 1 to FIG. 5, which are schematic diagrams showing steps for fabricating a MRAM device 1 according to one embodiment of the present disclosure, and are used to exemplarily illustrate the aforementioned method. In FIG. 1, a substrate 10 is first provided. The substrate 10 may be a silicon substrate, an epitaxial silicon substrate, a silicon carbide substrate or a silicon on insulator (SOI) substrate. The substrate 10 may have a MRAM region (not labeled) and a logic region (not shown). FIG. 1 exemplarily shows the MRAM region of the substrate 10.

Active devices such as metal-oxide semiconductor (MOS) transistors (not shown), passive devices (not shown) and conductive layers (not shown) may be formed on the substrate 10. An interlayer dielectric (ILD) layer 12 is disposed on the substrate 10 to cover the aforementioned active devices, passive devices and conductive layers. Specifically, planar or non-planar (such as fin-shaped structure) MOS transistors may be formed on the substrate 10. The MOS transistors may include transistor elements such as gate structures (such as metal gates), source/drain regions, spacers, epitaxial layers, and contact etch stop layer (CESL). The ILD layer 12 may be formed on the substrate 10 to cover the MOS transistors, and a plurality of contact plugs (not shown) may be formed in the ILD layer 12 to electrically connect to the gate structures and/or the source/drain regions of the MOS transistors. Since the fabrications of the planar or non-planar MOS transistors and the ILD layer 12 are well known to those skilled in the art, the details thereof are omitted herein.

Next, an inter-metal dielectric layer 15 is formed on the ILD layer 12, and metal interconnections 14 are formed in the inter-metal dielectric layer 15. Next, a stop layer 16 and an inter-metal dielectric layer 18 are sequentially formed on the inter-metal dielectric layer 15, and metal interconnections 20, such as the first metal interconnection 21 and the second metal interconnection 22, are formed in the stop layer 16 and the inter-metal dielectric layer 18. The metal interconnections 14, 20 are for electrically connecting the aforementioned contact plugs in the ILD layer 12. In the embodiment, each of the metal interconnections 14 is a trench conductor, and each of the metal interconnections 20 is a via conductor, which is exemplary and the present disclosure is not limited thereto. The metal interconnections 14, 20 may be embedded within the inter-metal dielectric layers 15, 18 and/or the stop layer 16 according to a single damascene process or a dual damascene process, and may be electrically connected with each other. Each of the metal interconnections 14, 20 may be independently a single-layer structure or a multi-layer structure (not shown). For example, each of the metal interconnections 14, 20 may include a low-resistance metal layer, and a material of the low-resistance metal layer may include, for example, tungsten (W), copper (Cu), aluminum (Al), titanium aluminum alloy (TiAl), cobalt tungsten phosphide (CoWP) or a combination thereof. In the embodiment, the material of the low-resistance metal layer of the metal interconnection 14 includes copper, and the material of the low-resistance metal layer of the metal interconnection 20 includes tungsten. The metal interconnection 14 may further include a barrier layer disposed between the low-resistance metal layer and the inter-metal dielectric layer 15, and the metal interconnection 20 may further include a barrier layer disposed between the low-resistance metal layer and the inter-metal dielectric layer 18. A material of the barrier layer may include titanium (Ti), titanium nitride (TiN), tantalum (Ta), tantalumnitride (TaN) or a combination thereof. Since the single damascene process and the dual damascene process are well known to those skilled in the art, the details thereof are omitted herein. A material of the inter-metal dielectric layers 15 and 18 may include tetraethoxysilane (TEOS) or silicon oxide. A material of the stop layer 16 may include nitrogen doped carbide (NDC), silicon nitride or silicon carbon nitride (SiCN), but not limited thereto.

Next, a bottom electrode 30 is formed on the inter-metal dielectric layer 18. The bottom electrode 30 may be a double layer structure, as shown in the part A of FIG. 6. However, for the sake of simplicity, the bottom electrode 30 in FIG. 1 to FIG. 5 is depicted as a single layer structure. For details of the bottom electrode 30, reference may be made to the related description of FIG. 6 to FIG. 8.

Figure 2:
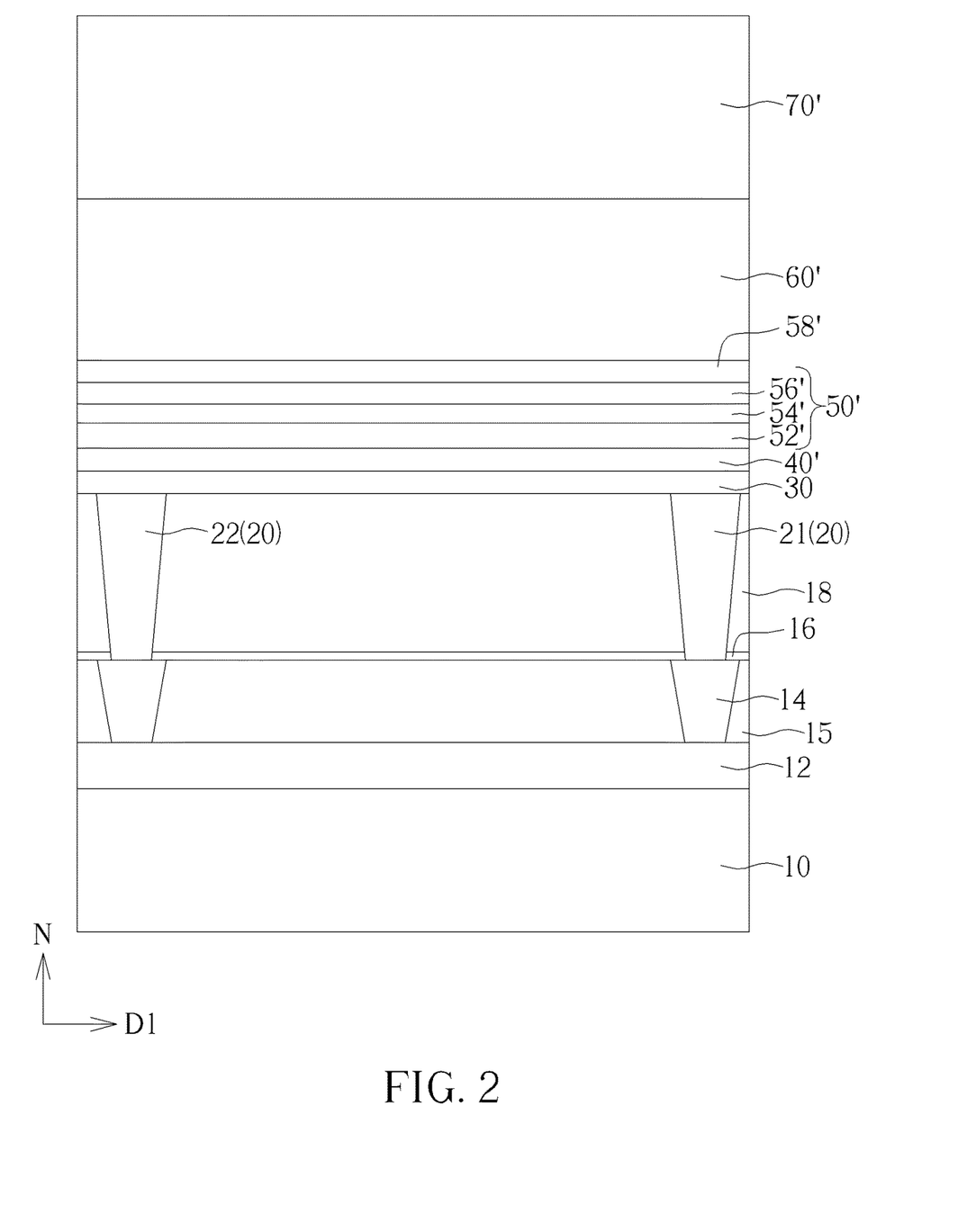

In FIG. 2, a SOT material layer 40' is formed on the bottom electrode 30. A material of the SOT material layer 40' may include tungsten (W), tantalum (Ta), platinum (Pt), hafnium (Hf) or a combination thereof. In the embodiment, the material of the SOT material layer 40' includes tungsten. Next, a MTJ stack 50' is formed on the SOT material layer 40'. The MTJ stack 50' may be formed by sequentially forming a free material layer 52', a barrier material layer 54' and a reference material layer 56' (also called a pinned material layer) on the SOT material layer 40'. The free material layer 52' may include a ferromagnetic material, such as iron, cobalt, nickel, or alloys thereof such as cobalt-iron-boron (CoFeB), but not limited thereto. The magnetized direction of the free material layer 52' may be altered freely depending on the influence of outside magnetic field. A material of the barrier material layer 54' may include an insulating material. For example, the insulating material may be an oxide, such as aluminum oxide ($AlO_x$) or magnesium oxide (MgO), but not limited thereto. A material of the reference material layer 56' may include an antiferromagnetic (AFM) material, such as ferromanganese (FeMn), platinum manganese (PtMn), iridium manganese (IrMn) or nickel oxide (NiO), but not limited thereto. In some embodiments, the material of the reference material layer 56' may be identical to the material of the free material layer 52'. Next, a cap material layer 58' may be optionally formed on the MTJ stack 50'. The cap material layer 58' may include a barrier cap material and/or a metal cap material. The barrier cap material may include magnesium oxide, and the metal cap material may include tantalum (Ta), tungsten (W) or ruthenium (Ru), but not limited thereto. Next, a top electrode material layer 60' is formed on the cap material layer 58' (i.e., indirectly formed on the MTJ stack 50'). A material of the top electrode material layer 60' may include a conductive material, such as titanium (Ti), titanium nitride (TiN), tantalum (Ta), tantalum nitride (TaN) or a combination thereof. In the embodiment, the material of the top electrode material layer 60' includes titanium nitride. Next, a mask 70' is formed on the top electrode material layer 60'. A material of the mask 70' may include a photoresist.

Figure 3:
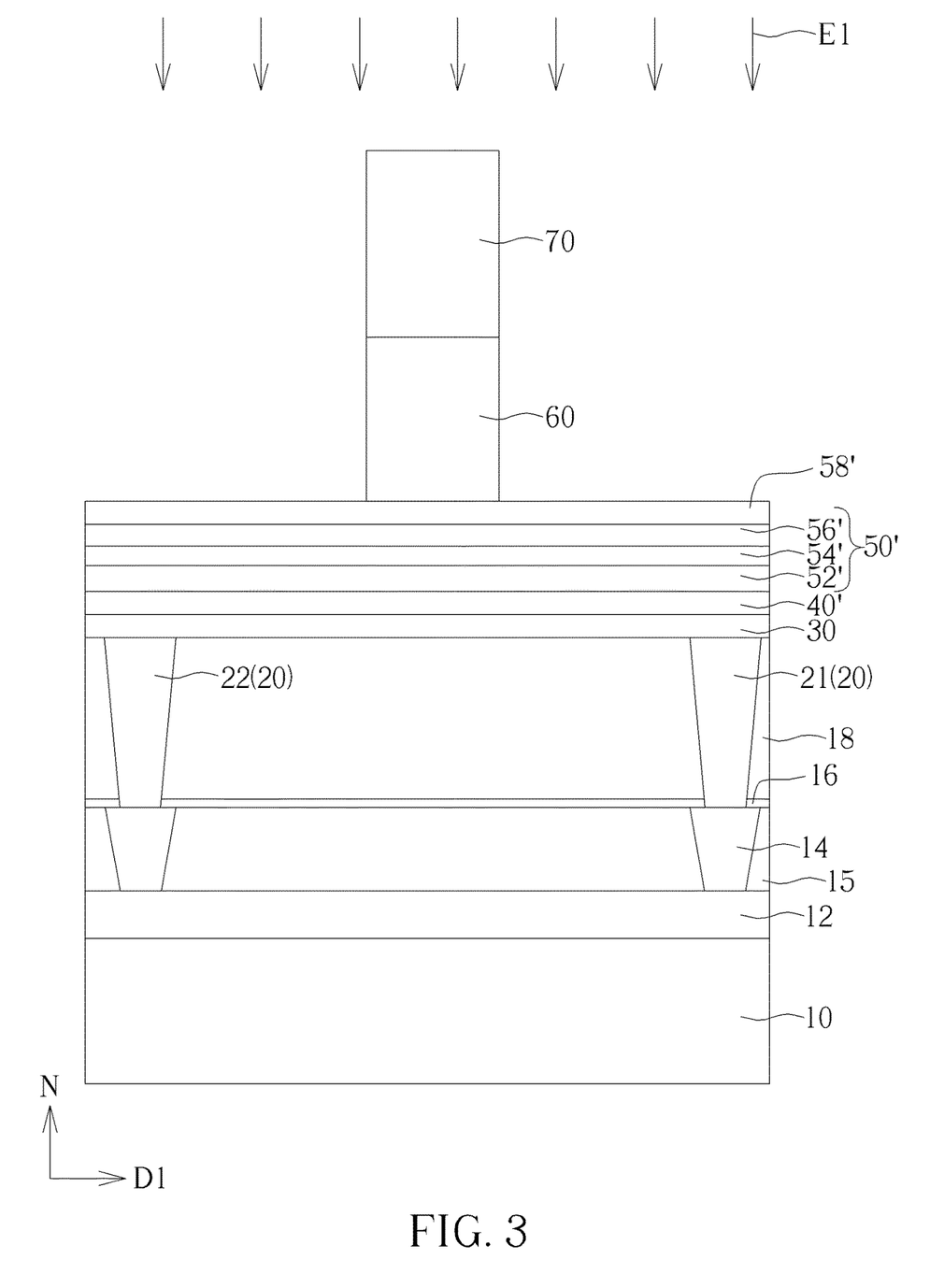
Figure 4:
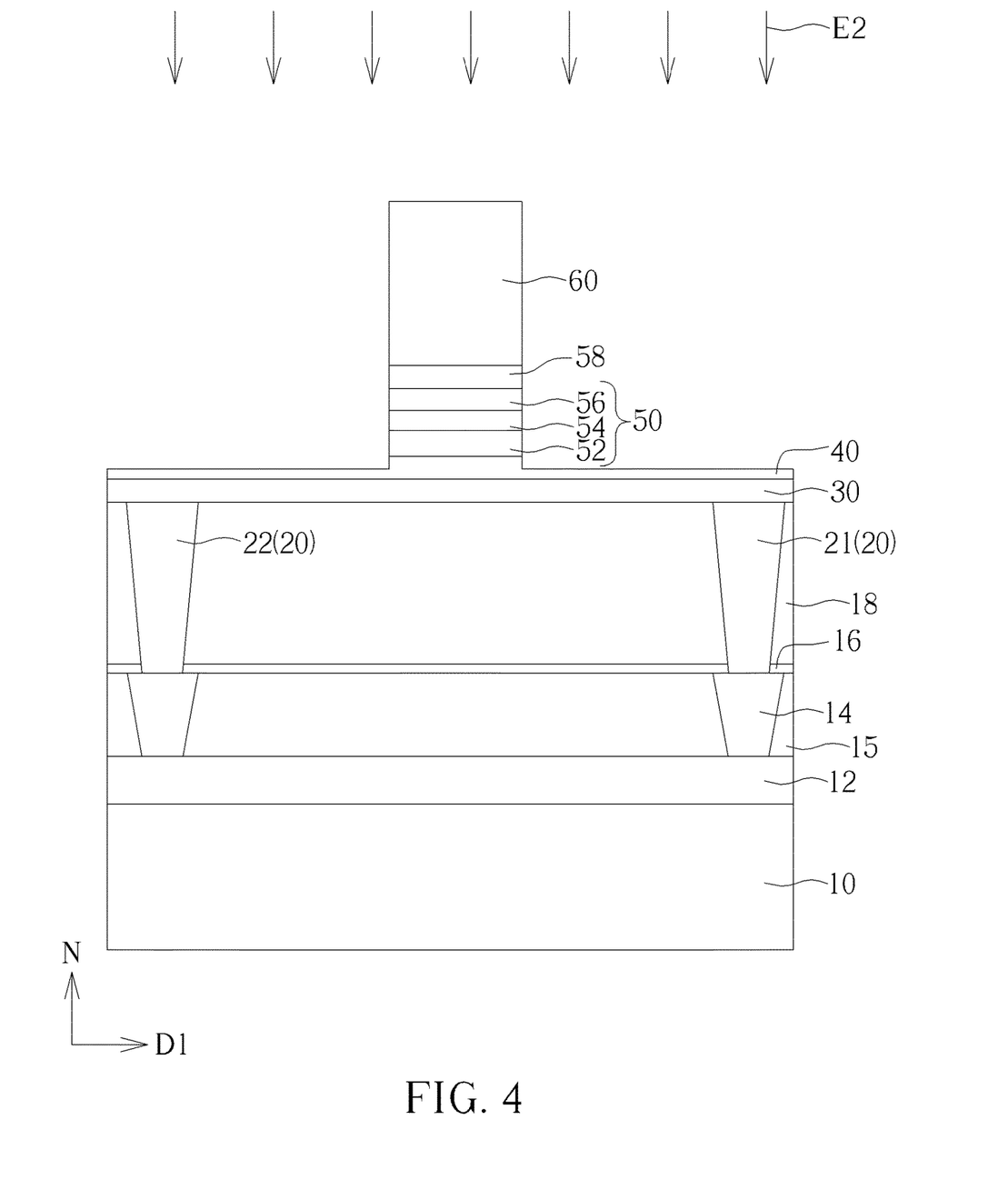
Figure 5:
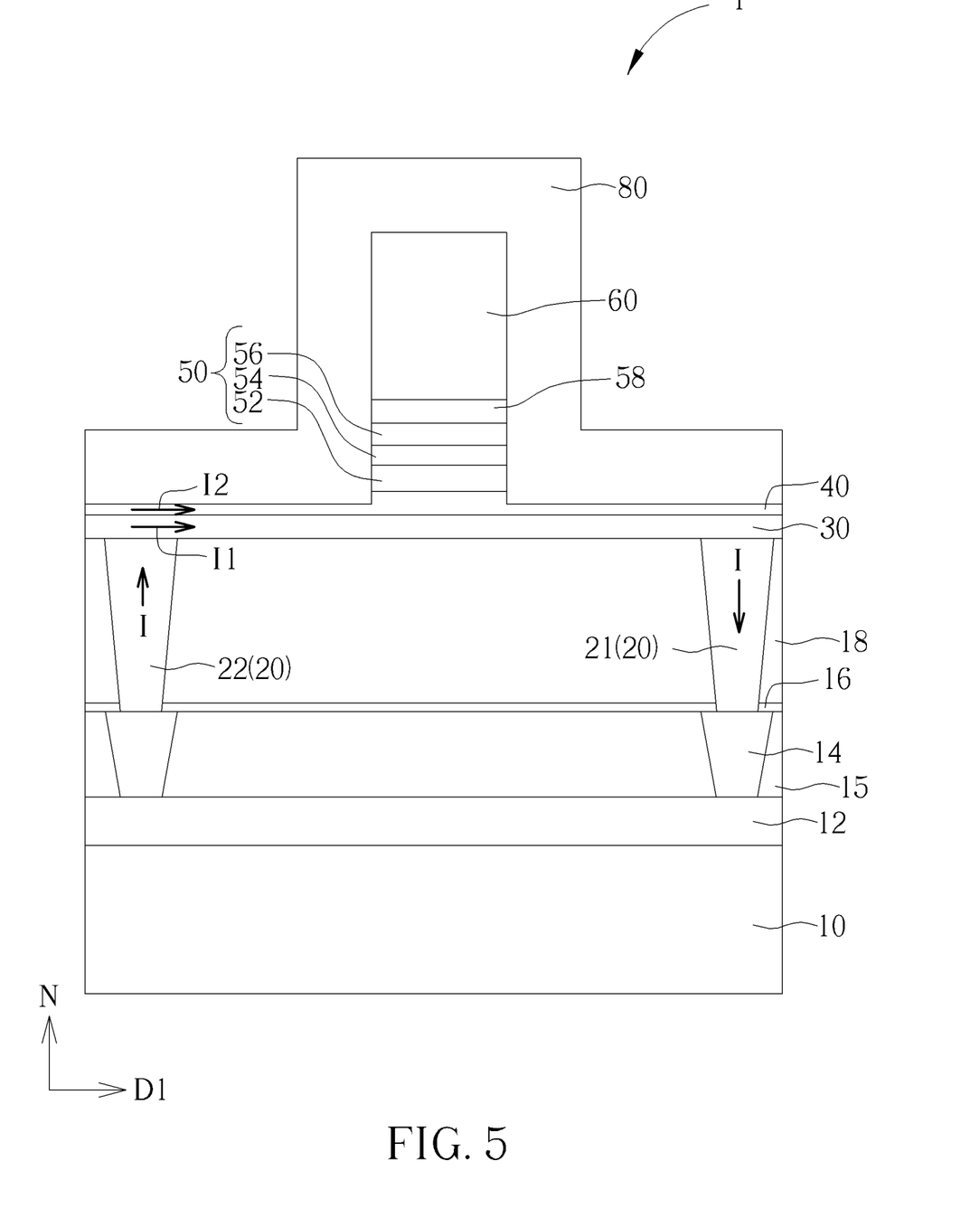

In FIG. 3, a first etching process E1 is performed to pattern the mask 70' and the top electrode material layer 60' to obtain a patterned mask 70 and a top electrode 60. In FIG. 4, a second etching process E2 is performed by using the patterned mask 70 and the top electrode 60 as a mask to pattern the cap material layer 58', the MTJ stack 50' and the SOT material layer 40' to obtain a cap layer 58, a MTJ 50, and a SOT layer 40. Afterward, the patterned mask 70 is removed. In FIG. 4, the SOT layer 40 has different thicknesses (not labeled) because a portion thereof is covered by the top electrode 60 and the other portion thereof is not covered by the top electrode 60. Specifically, the portion of the SOT layer 40 not covered by the top electrode 60 is etched to have a thinner thickness, and the portion of the SOT layer 40 covered by the top electrode 60 has a thicker thickness, but the present disclosure is not limited thereto. In other embodiment, the portion of the SOT layer 40 not covered by the top electrode 60 may not be removed by the second etching process E2. In FIG. 5, a dielectric cap layer 80 is formed to cover the top electrode 60, the cap layer 58, the MTJ 50 and the SOT layer 40 to complete the fabrication of the MRAM device 1. A material of the dielectric cap layer 80 may include but not limited to nitrogen doped carbide (NDC), silicon nitride (SiN) or silicon carbon nitride (SiCN). In the embodiment, the material of the dielectric cap layer 80 includes silicon nitride.

The aforementioned film layers, such as the bottom electrode 30, the SOT material layer 40', the free material layer 52', the barrier material layer 54', the reference material layer 56', the cap material layer 58', the top electrode material layer 60' and the mask 70', may be formed by any suitable methods. For example, the methods may be, but are not limited to, molecular-beam epitaxy (MBE), chemical vapor deposition (CVD), metal organic chemical vapor deposition (MOCVD), hydride vapor phase epitaxy (HVPE) and atomic layer deposition (ALD).

FIG. 5 shows the MRAM device 1 according to one embodiment of the present disclosure. The MRAM device 1 includes a bottom electrode 30, a SOT layer 40, a MTJ 50 and a top electrode 60. The SOT layer 40 is disposed on the bottom electrode 30. The MTJ 50 is disposed on the SOT layer 40. The top electrode 60 is disposed on the MTJ 50. The MTJ 50 includes a free layer 52, a barrier layer 54 and a reference layer 56 sequentially stacked from the SOT layer 40 to the top electrode 60. The MRAM device 1 may optionally include a cap layer 58 disposed between the MTJ 50 and the top electrode 60, and may optionally include a dielectric cap layer 80 covering the top electrode 60, the cap layer 58, the MTJ 50 and the SOT layer 40. Materials of the SOT layer 40, the MTJ 50, the cap layer 58 and the top electrode 60 may be respectively identical to that of the SOT material layer 40', the MTJ stack 50', the cap material layer 58' and the top electrode material layer 60', and are omitted herein.

Figure 6:
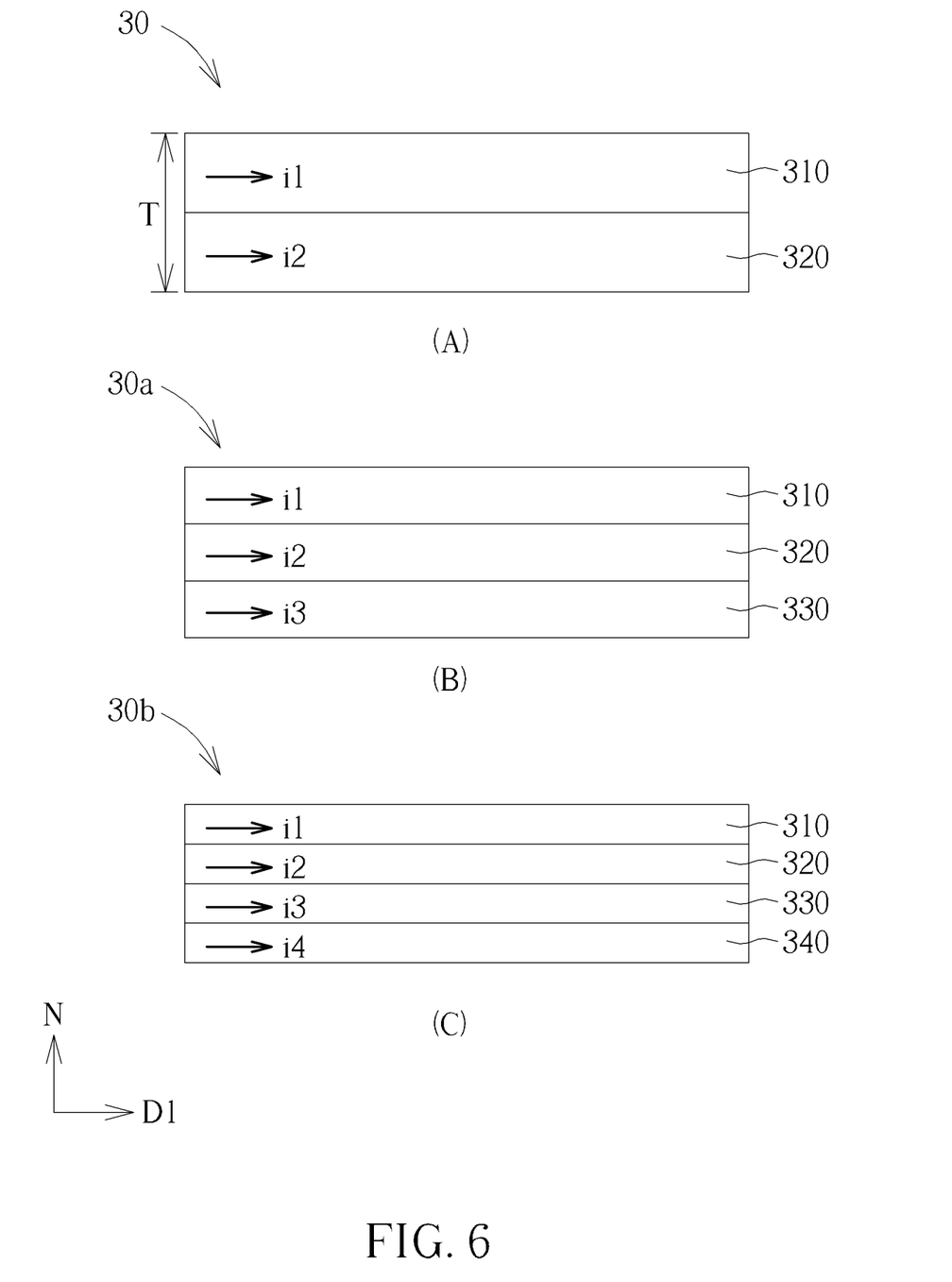
FIG. 6 is a schematic cross-sectional view of bottom electrodes according to some embodiments of the present disclosure.

Please refer to FIG. 6 simultaneously. FIG. 6 is a schematic cross-sectional view of bottom electrodes 30, 30a and 30b according to some embodiments of the present disclosure. As shown in the part A of FIG. 6, the bottom electrode 30 includes a first layer 310 and a second layer 320 connected with the first layer 310. A material of the first layer 310 includes $Ta_{x1}N_{y1}$, a material of the second layer 320 includes $Ta_{x2}N_{y2}$, and the following relationships may be satisfied: y2/x2>1, y1/x1≥1, and y2/x2>y1/x1. It is known that for nitrides of tantalum, when the ratio of the number of nitrogen ion to the number of tantalum ion is larger, the electrical resistivity of the nitrides of tantalum is larger. In TaN, the ratio of the number of nitrogen ion to the number of tantalum ion is equal to 1. Compared with the bottom electrode overall made of TaN, the bottom electrode 30 of the present disclosure has the material of the first layer 310 including $Ta_{x1}N_{y1}$ and the material of the second layer 320 including $Ta_{x2}N_{y2}$, the ratio of the number of nitrogen ion to the number of tantalum ion in $Ta_{x1}N_{y1}$ is greater than or equal to 1 (i.e., which satisfying the relationship: y1/x1≥1), and the ratio of the number of nitrogen ion to the number of tantalum ion in $Ta_{x2}N_{y2}$ is greater than 1 (i.e., which satisfying the relationship: y2/x2>1). In other words, when other conditions are the same, the electrical resistivity of the second layer 320 is greater than that of the first layer 310, and the electrical resistivity of the first layer 310 is greater than or equal to that of TaN. More specifically, when a thickness T of the bottom electrode 30 is the same as that of a bottom electrode (not shown) overall made of TaN, the bottom electrode 30 of the present disclosure can provide a larger electrical resistivity. According to one embodiment of the present disclosure, the electrical resistivity of the bottom electrode 30 may be greater than 300 micro-ohm-cm.

Please refer to FIG. 5 simultaneously. When a current I is introduced, the current I flows upward from the second metal interconnection 22 to the bottom electrode 30 and the SOT layer 40, wherein the current I splits off into the current I1 flowing into the bottom electrode 30 and the current I2 flowing into the SOT layer 40, and then the current I1 and the current I2 rejoin and flow downward into the first metal interconnection 21. The magnetic moment in the free layer 52 is mainly switched by the current I2. That is, the current I2 may be regarded as the effective writing current of the MRAM device 1. In the present disclosure, by increasing the electrical resistivity of the bottom electrode 30, the current I1 passing through the bottom electrode 30 may be reduced while the current I2 is maintained, thereby the current I may be reduced. Accordingly, it is beneficial to reduce the overall threshold current of the MRAM device 1.

Please refer to FIG. 5 and the part A of FIG. 6. In the bottom electrode 30, the second layer 320 is disposed on the inter-metal dielectric layer 18, the first layer 310 is disposed on the second layer 320, and the SOT layer 40 is disposed on the first layer 310. Specifically, the bottom electrode 30 defines a normal direction N, and the first layer 310 is closer to the SOT layer 40 than the second layer 320 along the normal direction N. However, the present disclosure is not limited thereto. When the positions of the first layer 310 and the second layer 320 are exchanged, the electrical resistivity of the bottom electrode 30 remains unchanged. That is, when the arranging sequence of the first layer 310 and the second layer 320 are reversed, an electrical resistivity which is greater than that of TaN can still be provided. In the normal direction N, the additional benefit providing by the first layer 310 being closer to the SOT layer 40 than the second layer 320 is explained as follows. Since the electrical resistivity of the second layer 320 is greater than that of the first layer 310, when the current is introduced, the current i1 passing through the first layer 310 is greater than the current i2 passing through the second layer 320. Because nitrides of tantalum also has some SOT material properties, the current i1 closer to the SOT layer 40 can assist in switching the magnetic moment of the free layer 52. That is, when the first layer 310 has a larger current i1, the efficiency of switching the magnetic moment in the free layer 52 can be improved. Furthermore, each layer of the bottom electrode 30 may be regarded as a current path. When the current path with lower electrical resistivity is adjacent to or directly contacts the SOT layer 40, the efficiency of switching the magnetic moment in the free layer 52 can be improved.

In the part A of FIG. 6, a thickness (not labeled) of the first layer 310 and a thickness (not labeled) of the second layer 320 are exemplarily depicted as the same. That is, both the thickness of the first layer 310 and the thickness of the second layer 320 are T/2. However, the present disclosure is not limited thereto. The thicknesses of the first layer 310 and the second layer 320 may be adjusted according to actual needs. Preferably, when the thickness of the layer with a higher electrical resistivity (herein, the second layer 320) is greater than the thickness of the layer with a lower electrical resistivity (herein, the first layer 320), the electrical resistivity of the bottom electrode 30 can be significantly greater than that of TaN.

Figure 9:
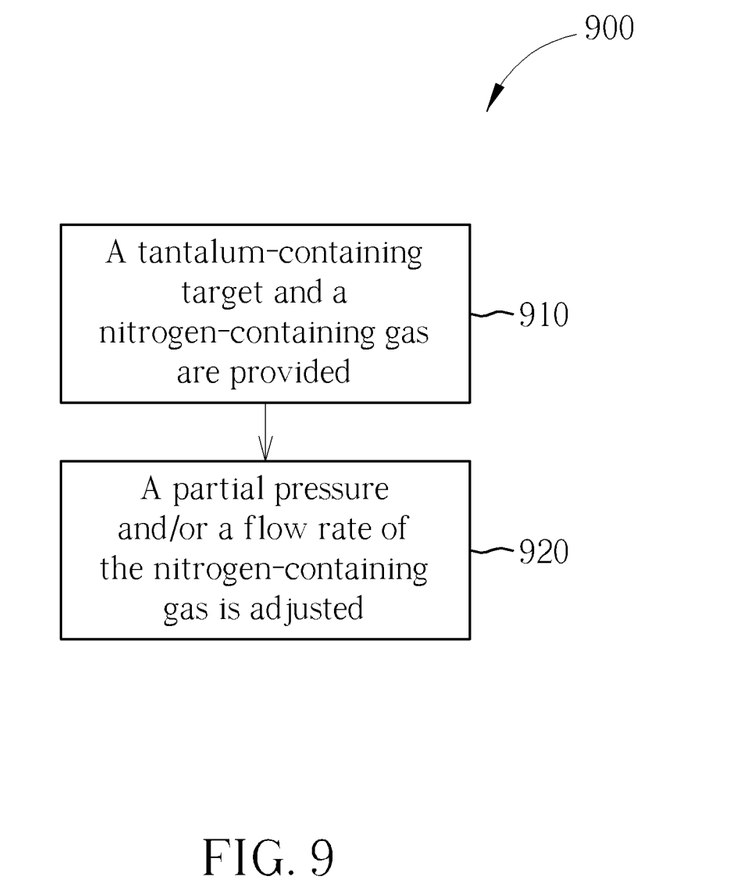
FIG. 9 is a flow diagram showing a method for fabricating a bottom electrode according to another embodiment of the present disclosure.

Please refer to FIG. 9, which is a flow diagram showing a method 900 for fabricating the bottom electrode 30 according to another embodiment of the present disclosure. The method 900 for fabricating the bottom electrode 30 may be a physical vapor deposition (PVD) process, which may include Step 910 and Step 920. In Step 910, a tantalum-containing target and a nitrogen-containing gas are provided. In Step 920, a partial pressure and/or a flow rate of the nitrogen-containing gas is adjusted. The aforementioned nitrogen-containing gas may include nitrogen ($N_2$) or ammonia ($NH_3$), and may optionally include argon (Ar). For example, when forming the first layer 310, the partial pressure of nitrogen or ammonia in the nitrogen-containing gas is less than that when forming the second layer 320. Alternatively, when forming the first layer 310, the flow rate of the nitrogen-containing gas is less than that when forming the second layer 320.

In other embodiments, the bottom electrode 30 may be replaced with the bottom electrode 30a in the part B of FIG. 6. The difference between the bottom electrode 30a and the bottom electrode 30 is the number of layers of the bottom electrode 30a being different from that of the bottom electrode 30. Specifically, the bottom electrode 30 is a double-layer structure, and the bottom electrode 30a is a three-layer structure. The bottom electrode 30a further includes a third layer 330. A material of the third layer 330 may include $Ta_{x3}N_{y3}$, and the following relationships are satisfied: $y3/x3>1$, and $y3/x3>y2/x2>y1/x1$. Compared with the bottom electrode (not shown) overall made of TaN, the bottom electrode 30a can provide a larger electrical resistivity. Please refer to FIG. 5 and the part B of FIG. 6 at the same time. In the bottom electrode 30a, the third layer 330 is disposed on the inter-metal dielectric layer 18, the second layer 320 is disposed on the third layer 330, the first layer 310 is disposed on the second layer 320, and the SOT layer 40 is disposed on the first layer 310. Specifically, the bottom electrode 30a defines a normal direction N, and the first layer 310 is closer to the SOT layer 40 than the second layer 320 and the third layer 330 along the normal direction N. However, the present disclosure is not limited thereto. When the arranging sequence of the first layer 310, the second layer 320 and the third layer 330 are altered, an electrical resistivity which is greater than that of TaN still can be provided by the bottom electrode 30a. In the bottom electrode 30a, the electrical resistivities of the layers decrease gradually from the inter-metal dielectric layer 18 to the SOT layer 40 (i.e., along the normal direction N). When the current path with lower electrical resistivity is adjacent to or directly contacts the SOT layer 40, the efficiency of switching the magnetic moment in the free layer 52 can be improved.

In other embodiments, the bottom electrode 30 may be replaced with the bottom electrode 30b in the part C of FIG. 6. The difference between the bottom electrode 30b and the bottom electrode 30a is the number of layers of the bottom electrode 30b being different from that of the bottom electrode 30a. Specifically, the bottom electrode 30b is a four-layer structure. The bottom electrode 30b further includes a fourth layer 340. A material of the fourth layer 340 may include $Ta_{x4}N_{y4}$, and the following relationships are satisfied: $y4/x4>1$, and $y4/x4>y3/x3>y2/x2>y1/x1$. Compared with the bottom electrode (not shown) overall made of TaN, the bottom electrode 30b can provide a larger electrical resistivity. As mentioned above, the arranging sequence of the first layer 310, the second layer 320, the third layer 330 and the fourth layer 340 may be altered. With the arrangement of the part C of FIG. 6, the electrical resistivities of the layers of the bottom electrode 30b decreases gradually from the inter-metal dielectric layer 18 to the SOT layer 40. When the current path with lower electrical resistivity is adjacent to or directly contacts the SOT layer 40, the efficiency of switching the magnetic moment in the free layer 52 can be improved.

As shown in FIG. 6, the bottom electrode according to the present disclosure may be a multi-layer structure, wherein at least one layer is made of nitrides of tantalum, and the ratio of the number of nitrogen ion to the number of tantalum ion is greater than 1, which is beneficial to reduce the current passing through the bottom electrode. Accordingly, it is beneficial to reduce the overall threshold current of the MRAM device. In the aforementioned multi-layer structure, each layer can be configured to have a uniform composition and satisfy the relationship of the ratio of the number of nitrogen ion to the number of tantalum ion thereof. The number, the thicknesses and the arranging sequence of the layers of each of the bottom electrodes in FIG. 6 are exemplary, and the number, the thicknesses and the arranging sequence of the layers of the bottom electrodes can be adjusted according to actual needs.

Figure 7:
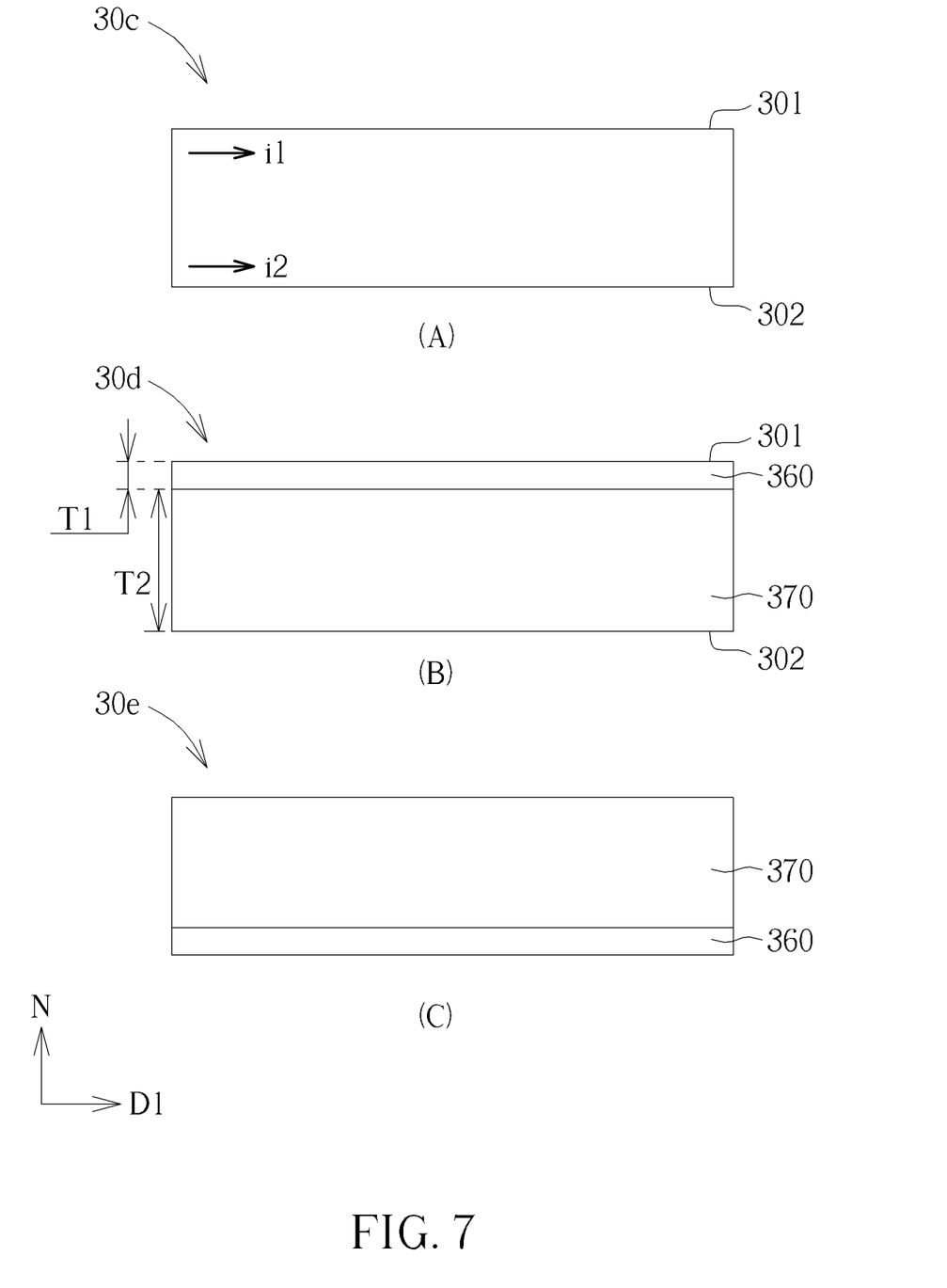
FIG. 7 is a schematic cross-sectional view of bottom electrodes according to further embodiments of the present disclosure.

In other embodiments, the bottom electrode 30 may be replaced with the bottom electrode 30c in the part A of FIG. 7. The difference between the bottom electrode 30c and the bottom electrode 30 is that the bottom electrode 30c is a single-layer structure. Specifically, the bottom electrode 30c defines a normal direction N, wherein a material of the bottom electrode 30c includes $Ta_xN_y$, y/x is increased gradiently along the normal direction N from a first surface 301 of the bottom electrode 30c to a second surface 302 of the bottom electrode 30c, and the following relationship is satisfied: $y/x>1$. For example, a material of the bottom electrode 30c closer to the first surface 301 may be $Ta_{x1}N_{y1}$, and a material of the bottom electrode 30c closer to the second surface 302 may be $Ta_{x2}N_{y2}$, and the following relationships are satisfied: $y2/x2>1$, $y1/x1 \geq 1$, and $y2/x2>y1/x1$. In other words, a concentration of nitrogen ion of the bottom electrode 30c is increased gradiently along the normal direction N from the first surface 301 of the bottom electrode 30c to the second surface 302 of the bottom electrode 30c. Compared with the bottom electrode (not shown) overall made of TaN, the bottom electrode 30c can provide a larger electrical resistivity. Furthermore, the electrical resistivity of the bottom electrode 30c is configured to decrease gradually from the inter-metal dielectric layer 18 to the SOT layer 40. The portion of the bottom electrode 30 with identical concentration of nitrogen ion may be regarded as a same current path. When the current path with lower electrical resistivity is adjacent to or directly contacts the SOT layer 40, the efficiency of switching the magnetic moment in the free layer 52 can be improved.

In other embodiments, the bottom electrode 30 may be replaced with the bottom electrode 30d in the part B of FIG. 7. The difference between the bottom electrode 30d and the bottom electrode 30c is that the bottom electrode 30d is a double-layer structure. Specifically, the bottom electrode 30d includes a first layer 360 and a second layer 370 connected with the first layer 360. A material of the first layer 360 may include TaN, and a material of the second layer may include $Ta_xN_y$, y/x is increased gradiently along the normal direction N from a first surface 301 of the bottom electrode 30d to a second surface 302 of the bottom electrode 30d, and the following relationship is satisfied: y/x≥1. That is, a portion of the bottom electrode 30c is replaced by TaN. Compared with the second layer 370, the first layer 360 has a uniform composition. That is, in each portion of the first layer 360, the ratio of the number of nitrogen ion to the number of tantalum ion is equal to 1. Compared with the bottom electrode (not shown) overall made of TaN, the bottom electrode 30d can provide a larger electrical resistivity. Furthermore, a thickness T1 of the first layer 360 may be less than a thickness T2 of the second layer 370, such that the electrical resistivity of the bottom electrode 30d can be significantly greater than that of TaN. Furthermore, an electrical resistivity of the first layer 360 is less than that of the second layer 370, and the first layer 360 is closer to the SOT layer 40 than the second layer 370 along the normal direction N. When the current path with lower electrical resistivity is adjacent to or directly contacts the SOT layer 40, the efficiency of switching the magnetic moment in the free layer 52 can be improved.

In other embodiment, the bottom electrode 30 may be replaced with the bottom electrode 30e in the part C of FIG. 7. The difference between the bottom electrode 30e and the bottom electrode 30d is that the arranging sequence of the first layer 360 and the second layer 370 is reversed. Compared with the bottom electrode (not shown) overall made of TaN, the bottom electrode 30e can provide a larger electrical resistivity. For other details of the bottom electrode 30e, reference may be made to the related description of the bottom electrode 30d, and are omitted herein.

As shown in FIG. 7, the bottom electrode according to the present disclosure may be a single-layer structure or a multi-layer structure, wherein at least one layer is made of nitrides of tantalum, the ratio of the number of nitrogen ion to the number of tantalum ion is greater than or equal to 1, and a concentration of nitrogen ion of the bottom electrode is increased gradiently along the normal direction N from the first surface (the surface closer to the SOT layer) of the bottom electrode to the second surface (the surface farther from the SOT layer) of the bottom electrode 30, which is beneficial to reduce the current passing through the bottom electrode. Accordingly, it is beneficial to reduce the overall threshold current of the MRAM device. The number, the thicknesses and the arranging sequence of the layers of each of the bottom electrodes in FIG. 7 are exemplary, and the number, the thicknesses and the arranging sequence of the layers of the bottom electrodes can be adjusted according to actual needs.

Figure 8:
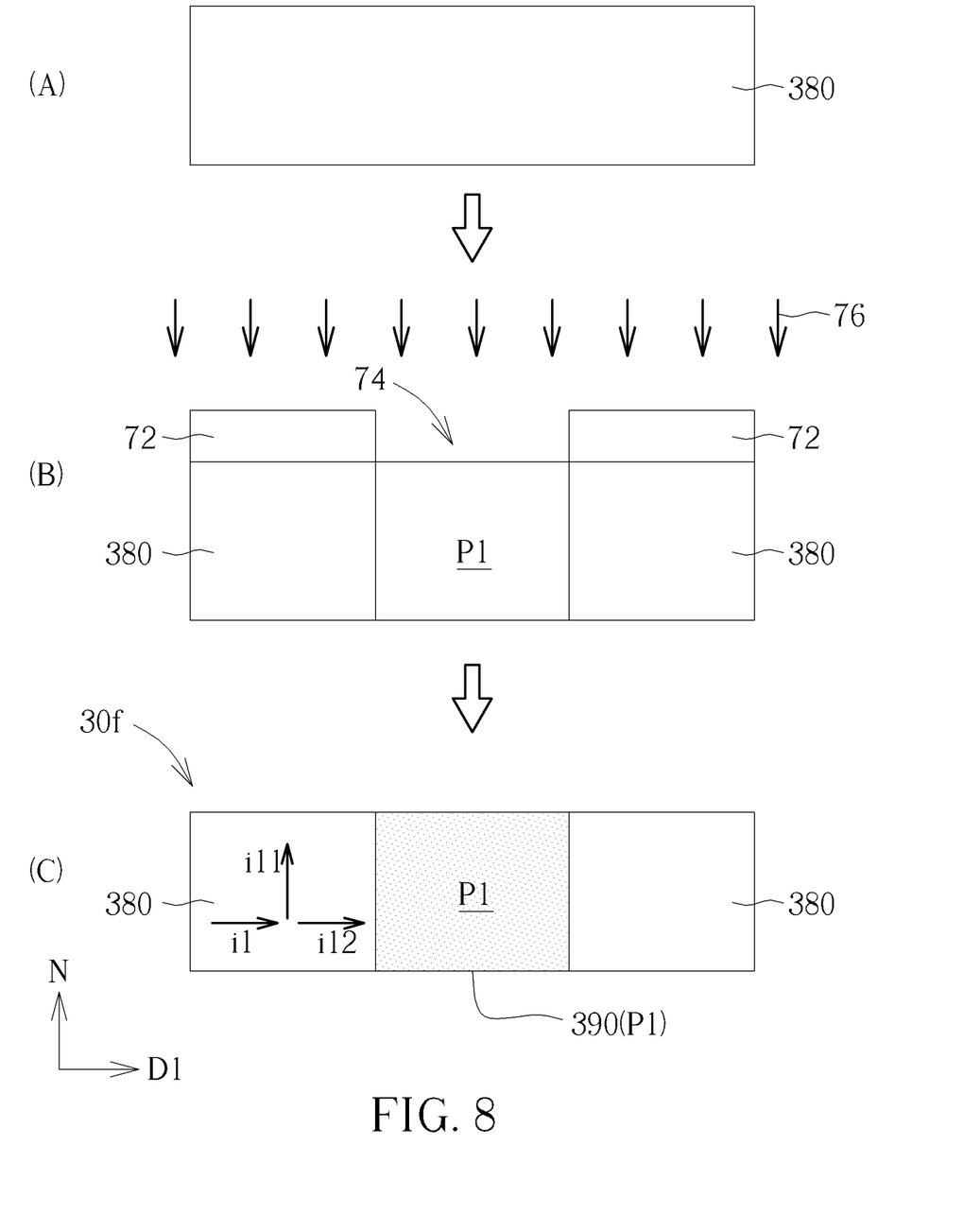
FIG. 8 is a schematic diagram showing steps for fabricating a bottom electrode according to one embodiment of the present disclosure.

The bottom electrode 30 may be replaced with the bottom electrode 30f in the part C of FIG. 8. The bottom electrode 30f includes a first layer 380 and a second layer 390 connected with the first layer 380. A material of the first layer 380 includes $Ta_{x1}N_{y1}$, a material of the second layer 390 includes $Ta_{x2}N_{y2}$, and the following relationships are satisfied: y2/x2>1, y1/x1>1, and y2/x2>y1/x1. That is, the electrical resistivity of the second layer 390 is greater than that of the first layer 380, and the electrical resistivity of the first layer 380 is greater than or equal to that of TaN. Compared with the bottom electrode (not shown) overall made of TaN, the bottom electrode 30f can provide a larger electrical resistivity. Specifically, the bottom electrode 30f defines a normal direction N, and the first layer 380, the second layer 390 and the first layer 380 are sequentially disposed adjacent to each other along a first direction D1 perpendicular to the normal direction N. The second layer 390 overlaps the MTJ 50 (see FIG. 5) along the normal direction N, and the first layer 380 does not overlap the MTJ 50 along the normal direction N. Thereby, when the current i1 flows from the first layer 380 located at left side to the first layer 380 located at right side, the current i1 splits off into the current i11 and the current i12, wherein the current i12 flows along the first direction D1 into the second layer 390, and the current i11 flows upward into the SOT layer 40. With the second layer 390 is arranged with a larger electrical resistivity, it is beneficial to reduce the current i12 and increase the current i11. Accordingly, it is beneficial to improve the efficiency of the SOT layer 40 to switch the magnetic moment in the free layer 52.

The method for fabricating the bottom electrode 30f is as follows. As shown in the part A of FIG. 8, a first layer 380 may be first formed. For example, the first layer 380 may be formed on the inter-metal dielectric layer 18 (see FIG. 1). A material of the first layer 380 includes the $Ta_{x1}N_{y1}$, and the following relationship is satisfied: y1/x1≥1. Next, a patterned mask 72 is formed on the first layer 380, wherein the patterned mask 72 has an opening region 74 corresponding to the MTJ 50. That is, the position of the opening region 74 corresponds to the position where the MTJ 50 to be formed subsequently. Alternatively, the opening region 74 overlaps the position where the MTJ 50 to be formed subsequently along the normal direction N. Next, an ion implantation process 76 is performed, wherein a nitrogen-containing gas (not shown) is implanted into a portion P1 of the first layer 380 corresponding to the opening region 74, so that the portion P1 of the first layer 380 is converted into a second layer 390. A material of the second layer 390 includes $Ta_{x2}N_{y2}$, and the following relationships are satisfied: y2/x2≥1, and y2/x2>y1/x1.

Compared with the prior art, the MRAM device according to the present disclosure adopts the SOT technology to switch the magnetic moment, which affects the magnetic moment of the free layer by spin current. Therefore, it is beneficial to improve the write speed of the MRAM device. Moreover, in the MRAM device of the present disclosure, the material of the bottom electrode includes nitrides of tantalum, and at least a portion of the nitrides of tantalum has the ratio of the number of nitrogen ion to the number of tantalum ion being greater than 1, which is beneficial to reduce the current passing through the bottom electrode. Accordingly, it is beneficial to reduce the overall threshold current of the MRAM device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetoresistive random access memory (MRAM) device, comprising:
   a bottom electrode comprising a first layer and a second layer connected with the first layer, wherein a material of the first layer comprises $Ta_{x1}N_{y1}$, a material of the second layer comprises $Ta_{x2}N_{y2}$, and the following relationships are satisfied: y2/x2>1, y1/x1>1, and y2/x2>y1/x1;
   a spin orbit torque (SOT) layer disposed on the bottom electrode;

a magnetic tunneling junction (MTJ) disposed on the SOT layer; and a top electrode disposed on the MTJ.

2. The MRAM device of claim 1, wherein the MTJ comprises a free layer, a barrier layer and a reference layer sequentially stacked from the SOT layer to the top electrode.

3. The MRAM device of claim 1, wherein the bottom electrode defines a normal direction, and the first layer is closer to the SOT layer than the second layer along the normal direction.

4. The MRAM device of claim 1, wherein the bottom electrode defines a normal direction, the second layer overlaps the MTJ along the normal direction, and the first layer is disposed adjacent to the second layer along a first direction perpendicular to the normal direction.

5. The MRAM device of claim 4, wherein the first layer does not overlap the MTJ along the normal direction.

6. The MRAM device of claim 1, wherein the bottom electrode further comprises a third layer, a material of the third layer comprises $Ta_{x3}N_{y3}$, and the following relationships are satisfied: $y3/x3>1$, and $y3/x3>y2/x2>y1/x1$.

7. The MRAM device of claim 6, wherein the bottom electrode defines a normal direction, and the first layer is closer to the SOT layer than the second layer and the third layer along the normal direction.

8. The MRAM device of claim 1, wherein an electrical resistivity of the bottom electrode is greater than 300 micro-ohm-cm.

9. A MRAM device, comprising:
a bottom electrode, defining a normal direction, wherein a material of the bottom electrode comprises $Ta_xN_y$, $y/x$ is increased gradiently along the normal direction from a first surface of the bottom electrode to a second surface of the bottom electrode, and the following relationship is satisfied: $y/x \geq 1$;

a SOT layer disposed on the first surface of the bottom electrode;

a MTJ disposed on the SOT layer; and a top electrode disposed on the MTJ.

10. The MRAM device of claim 9, wherein the MTJ comprises a free layer, a barrier layer and a reference layer sequentially stacked from the SOT layer to the top electrode.

11. The MRAM device of claim 9, wherein the bottom electrode comprises a first layer and a second layer connected with the first layer, wherein a material of the first layer comprises TaN, and a material of the second layer comprises the $Ta_xN_y$.

12. The MRAM device of claim 11, wherein the first layer is closer to the SOT layer than the second layer along the normal direction.

13. A method for fabricating a MRAM device, comprising:
forming a bottom electrode, wherein a material of the bottom electrode comprises $Ta_{x1}N_{y1}$ and $Ta_{x2}N_{y2}$, and the following relationships are satisfied: $y2/x2>1$, $y1/x1>1$, and $y2/x2>y1/x1$;

forming a SOT layer on the bottom electrode;

forming a MTJ on the SOT layer; and forming a top electrode on the MTJ.

14. The method of claim 13, wherein forming the SOT layer on the bottom electrode, forming the MTJ on the SOT layer and forming the top electrode on the MTJ comprise:
forming a SOT material layer on the bottom electrode;
forming a MTJ stack on the SOT material layer;
forming a top electrode material layer on the MTJ stack; and
patterning the top electrode material layer, the MTJ stack and the SOT material layer.

15. The method of claim 13, further comprising:
forming a dielectric cap layer to cover the top electrode, the MTJ and the SOT layer.

16. The method of claim 13, wherein the bottom electrode is formed by a physical vapor deposition process.

17. The method of claim 16, wherein the physical vapor deposition process comprises:
providing a tantalum-containing target and a nitrogen-containing gas; and
adjusting a partial pressure and/or a flow rate of the nitrogen-containing gas.

18. The method of claim 13, wherein the bottom electrode comprises a first layer and a second layer connected with the first layer, a material of the first layer comprises the $Ta_{x1}N_{y1}$, and a material of the second layer comprises the $Ta_{x2}N_{y2}$.

19. The method of claim 13, wherein the bottom electrode defines a normal direction, a concentration of nitrogen ion of the bottom electrode is increased gradiently along the normal direction from a first surface of the bottom electrode to a second surface of the bottom electrode.

20. The method of claim 13, wherein forming the bottom electrode comprises:
forming a layer, wherein a material of the layer comprises the $Ta_{x1}N_{y1}$;
forming a patterned mask on the layer, wherein the patterned mask has an opening region corresponding to a position of the MTJ to be formed; and
performing an ion implantation process, wherein a nitrogen-containing gas is implanted into a portion of the layer corresponding to the opening region to allow the portion of the layer to have a material comprising the $Ta_{x2}N_{y2}$, the portion of the layer is a second layer, and another portion of the layer other than the portion of the layer is a first layer.

* * * * *